United States Patent [19]

Butler et al.

[11] 4,235,011

[45] Nov. 25, 1980

[54] SEMICONDUCTOR APPARATUS

[75] Inventors: Douglas B. Butler, Maple Grove; Thomas E. Hendrickson, Wazata; Ronald G. Koelsch, Plymouth, all of Minn.

[73] Assignee: Honeywell Inc., Minneapolis, Minn.

[21] Appl. No.: 24,839

[22] Filed: Mar. 28, 1979

[51] Int. Cl.³ .............................................. B01J 17/00
[52] U.S. Cl. ................................ 29/571; 29/577 C; 29/578; 357/42
[58] Field of Search .................... 29/571, 577, 578; 357/41, 42

[56] References Cited

U.S. PATENT DOCUMENTS

| | | |
|---|---|---|
| 3,427,514 | 2/1969 | Olmstead . |
| 3,855,610 | 12/1974 | Masuda . |
| 3,909,306 | 9/1975 | Sakamoto . |
| 3,984,822 | 10/1976 | Simko . |
| 4,015,278 | 3/1977 | Fukuta . |
| 4,016,587 | 4/1977 | De La Moneda . |
| 4,131,908 | 12/1978 | Daub ...................................... 357/42 |
| 4,182,636 | 1/1980 | Dennard ............................... 29/571 |

Primary Examiner—W. C. Tupman
Attorney, Agent, or Firm—Theodore F. Neils

[57] ABSTRACT

A method for fabricating a field-effect transistor device is provided with the device resulting having a relatively substantial capability to withstand reverse bias voltages. The device can also be provided having a relatively low "on" condition resistance between the source and drain terminals thereof by virtue of a geometrical design choice.

9 Claims, 8 Drawing Figures

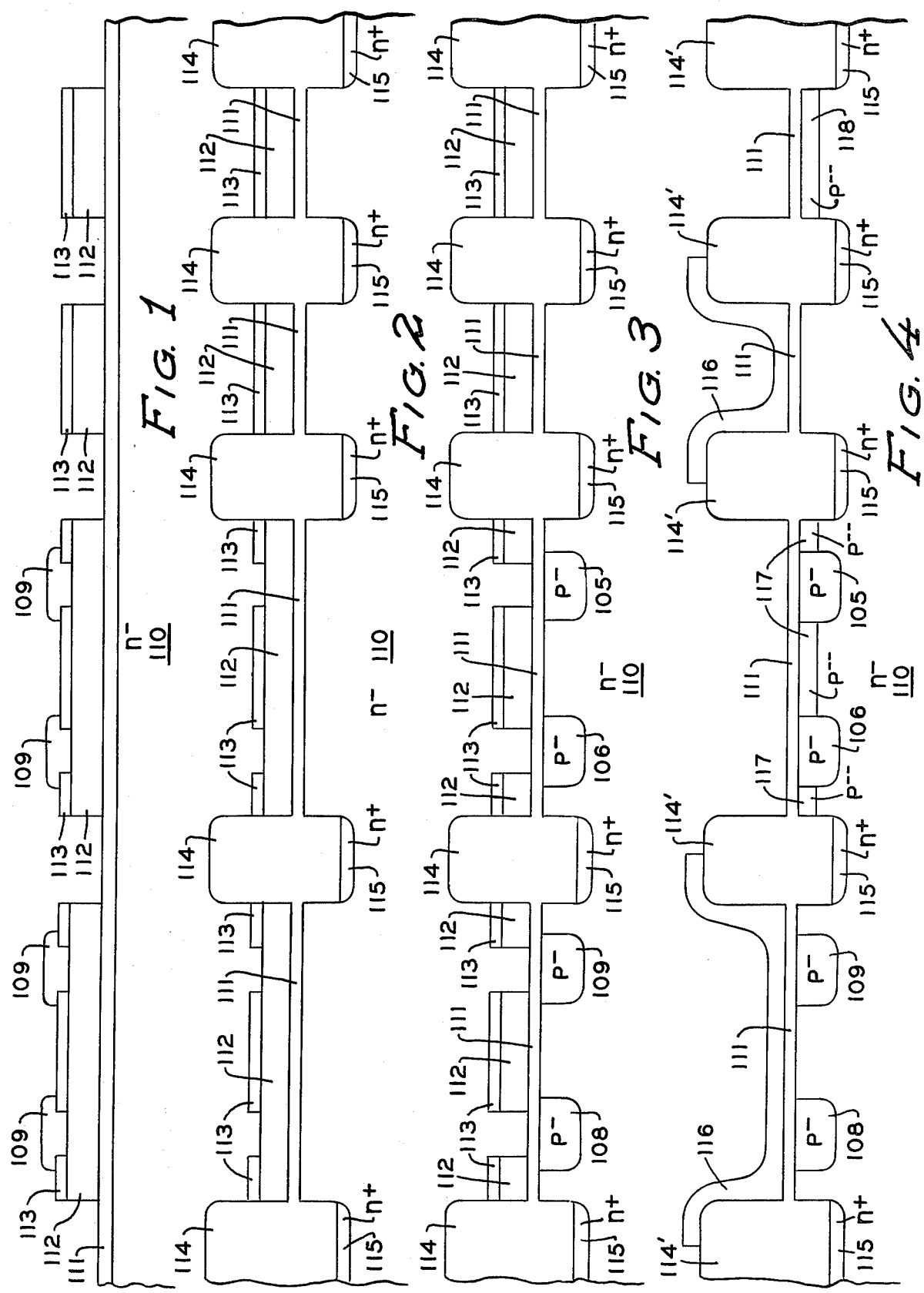

SEMICONDUCTOR APPARATUS

Reference is hereby made to a copending application by T. E. Hendrickson and R. G. Koelsch entitled "Semiconductor Apparatus" having Ser. No. 024,840 which is filed on even date with present application and which is assigned to the same assignee as the present application. This copending application discloses to some extent but does not claim the method for fabricating the semiconductor device which is specifically disclosed and claimed in the present application.

BACKGROUND OF THE INVENTION

The present invention is related to the fabrication of field-effect transistor devices for electrical signal control and switching, particularly analog signals.

The field-effect transistor has several attributes which are attractive for analog signal switching. These have been set out in the above referenced copending application filed on even date with the present application. Among the field-effect transistor device designs disclosed therein is one of a design leading to having a relatively substantial minimum breakdown voltage characteristic. A method for fabricating such a device, either as a discrete or in a monolithic integrated circuit, is needed which is compatible with fabricating ordinary MOS field-effect transistors in a monolithic integrated circuit.

SUMMARY OF THE INVENTION

A method for constructing a field-effect transistor device having both a gate region and a shield region therein is disclosed where these regions provide self-alignment of various portions of the semiconductor material source and drain regions, i.e. channel terminating regions, and where a further portion of these source and drain regions is provided before either the gate region or the shield region is provided.

BRIEF DESCRIPTION OF THE DRAWINGS

FIGS. 1 through 8 show the results of steps in a method for fabricating a field-effect transistor device of the present invention.

DESCRIPTION OF THE PREFERRED EMBODIMENT

Figure 5:
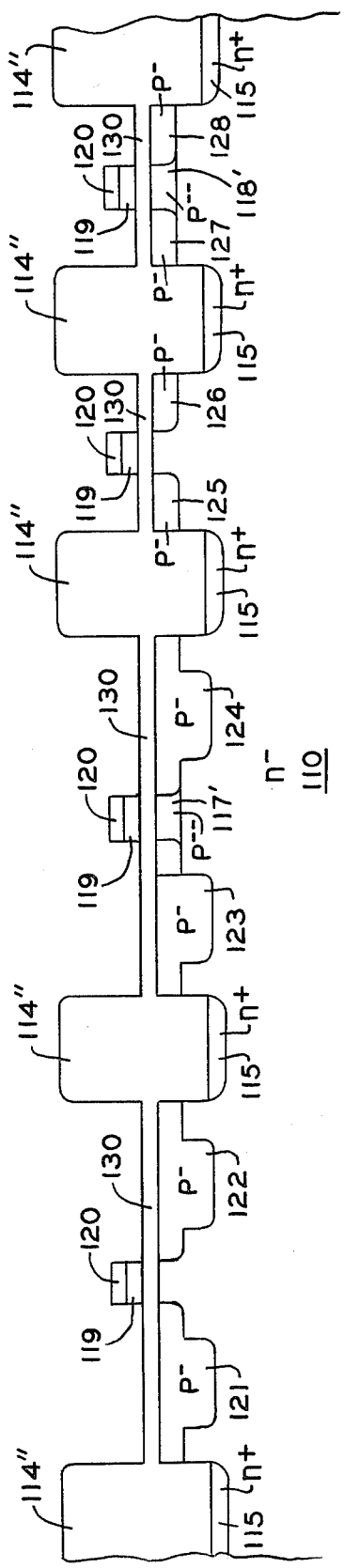

Results of steps in a fabrication process for manufacturing relatively high minimum breakdown voltage field-effect transistor devices simultaneously with fabricating rather ordinary field-effect transistors appear in FIGS. 1 through 7. This process begins with obtaining a semiconductor material body, typically a silicon body doped with phosphorus to the extent of having a resistivity of approximately 12 ohm-cm. A range of resistivities could be used for this semiconductor material body above and below the 12 ohm-cm typically used depending on other design needs. The silicon semiconductor material body is typically Czochralski grown having a major surface through and on which the fabrication process will take place which is a (100) plane. This semiconductor material body is designated 110 in FIG. 16A and is shown to have a $n^-$-type conductivity.

A thin layer of silicon dioxide, 111, is thermally grown on the major surface of semiconductor material body 110 by placing the body in an oxygen atmosphere at 975° C. for two hours, this layer having a thickness of approximately 650Å. Then, a layer of silicon nitride, 112, is deposited on the surface of layer 111 in a standard chemical vapor deposition process, the silicon nitride layer being approximately 2000Å thick. This is followed by depositing yet another layer of silicon dioxide, 113, of approximately 1000Å thickness onto layer 112, again by using a standard chemical vapor deposition process. Finally, a photoresist layer is provided on layer 113 with this photoresist layer having openings therein in a desired pattern all done using a standard process.

Silicon dioxide layer 113 is then etched through the openings in the photoresist layer using buffered HF. These openings in silicon dioxide layer 113 are provided, first, to determine where the field regions will be formed which will separate from one another the electronic component devices to be formed in the process. These field regions surround and so outline the feature regions in and below which the individual electronic component devices will be formed. Also, some of these openings in layer 113 are provided to later outline a portion in each of the source and drain regions, i.e. terminating regions, to be provided in the high breakdown voltage enhancement mode and depletion mode MOS field-effect transistor devices to be formed.

While MOS field-effect transistor devices having but a single source and single drain will be shown as being formed in the four feature regions provided in FIG. 16A, field-effect device of the kind described in the above referenced copending application, having many sources and drains each, can also be formed by the same process. They would be represented in FIG. 16 by larger feature areas which would accommodate several sources and drains in the manner described in the above referenced copending application.

The remainder of the first provided photoresist layer is stripped using an etchant and a second photoresist layer having a desired pattern of openings therein is provided by a standard process on the remaining portions of silicon dioxide layer 113 and the exposed portions of silicon nitride layer 112. The openings in this second photoresist layer occur over the openings in silicon dioxide layer 113 provided for defining the field regions, but do not occur over the other openings in layer 113 which will be used in providing portions of the source and drain regions as indicated above. The remaining portions of the second photoresist layer are designated 109 in FIG. 1.

Thereafter, silicon nitride 112 is etched through both the openings in layer 109 and layer 113 using a standard plasma etching process to provide openings in layer 112 where the field regions of the device are to be located. Following this plasma etch, photoresist 109 is stripped away by etching. Then field region implants are provided using phosphorus ions at 120kev with a dose of $10^{13}$ ions/cm² with opened silicon nitride 112 serving as an implantation mask. This implantation is used to adjust the field regions threshold, increasing it to prevent MOS field-effect transistor action between adjacent electronic component devices formed in adjacent feature regions. The implantation step forms an $n^+$-type conductivity region at approximately 0.1 μm below the major surface of semiconductor material body 110.

The field regions are then oxidized by thermal growth through the openings occurring in both silicon dioxide layer 113 and silicon nitride layer 112 by placing the structure at 975° C. for ten hours in an oxygen atmosphere to form the field oxide, 114. Concurrently, the original implanted ions in the field regions are driven deeper by diffusion into semiconductor material body 110. The results are shown in FIG. 2 where the original implanted phosphorus ions in the field regions have been driven to a depth of 1.0 μm and are designated 115.

Thereafter, a dip etch in buffered HF is used to remove the thin oxidation of silicon nitride 112 through the openings occurring in silicon dioxide layer 113 which were earlier filled by photoresist 109. Silicon nitride layer 112 is then wet chemically etched using $H_3PO_4$ through the openings exposed in layer 113 through removing photoresist 109 and the oxidized silicon nitride. This is followed by a boron ion implantation step, again using the remnants of silicon nitride layer 112 as an implantation mask. The boron ions are provided at an energy of 100kev in a dose of from 1 to $24 \times 10^{12}$ ions/cm$^2$. The boron ion dose used will depend on the resistivity chosen initially for semiconductor material body 110 and the breakdown voltages desired, as indicated in the copending application referenced above. Since the silicon nitride remnants are used again to mask this second implant as they did to mask the first implant, the implanted regions just formed are self-aligned to the field regions.

This boron implantation step is followed by a diffusion at 1100° C. in a nitrogen atmosphere for 14 hours to provide p$^-$-type conductivity regions, as part of the final channel terminating regions, i.e. final source and drain regions, in the high breakdown MOS field-effect transistor devices. These regions are designated 107 and 108 for the enhancement mode device and 105 and 106 for the depletion mode device. The pn junctions about these regions reach depths of about 2.5 μm below the major surface of semiconductor material body 110. Regions 115 are also driven further into the semiconductor material body 110. The results are shown in FIG. 3.

Without further masking, the remnants of silicon dioxide layer 113 are then etched away using buffered HF. No masking is required because layer 113 is much thinner than field oxide 114 and the simultaneous etching thereof with the etching of layer 113 does not remove too much of regions 114. As a result of this etching, layer 114 is designated 114'. Then, the exposed portions of semiconductor material body 110 in the openings in silicon nitride layer 112 are oxidized by thermally growing a thin layer of silicon dioxide through placing the structure at 1100° C. for one hour in an oxygen atmosphere to reform layer 111. Upon completing this thermal oxide growth, all of the silicon nitride remnants of layer 112 are stripped away by etching with $H_3PO_4$.

Next, a photoresist layer having selected openings therein is provided over the surface of oxide layer 111 in a standard process. These openings are made in this photoresist layer by a standard process to expose those portions of layer 111 over feature regions that are to have depletion mode devices formed therein and are therefore to undergo an ion implantation to form a depletion mode region. In FIGS. 1 through 7, the fabrication process will demonstrate both making ordinary MOS field-effect transistors and high breakdown voltage MOS field-effect transistors. In addition, one ordinary MOS field-effect transistor will be an enhancement mode transistor and the other will be a depletion mode transistor. These same alternatives will be shown for the high breakdown voltage MOS field-effect transistors.

After the openings are provided in the photoresist layer on layer 111, another ion implantation step is performed using boron ions having an energy of 100kev with a dose of from 0.5 to $4.0 \times 10^{12}$ ions/cm$^2$. The result is shown in FIG. 4 where the the photoresist layer has been designated 116. The depletion mode region in the high breakdown MOS field-effect transistor has been designated 117 while the depletion mode region for the ordinary MOS field-effect transistor has been designated 118.

After completing the depletion mode region implant step, the remnants of photoresist layer 116 are then stripped away. Then, the device is annealed at 975° C. in a nitrogen atmosphere for 30 minutes. The resulting depletion mode regions have pn junctions separating them from the remaining portions of semiconductor material body 110 which are located approximately 0.3 μm below the major surface of semiconductor material body 110. Thereafter, silicon dioxide layer 111 is etched away from the feature regions without any further masking, again, because the field-oxide regions 114' are relatively thick. Of course, the etchant removes part of these field oxide regions and so these are now redesignated 114''.

A gate oxidation step then follows which is accomplished by thermally growing silicon dioxide through placing the structure at 975° C. in an oxygen atmosphere containing 4% HCl until the gate oxide thickness reaches somewhere between 2500 and 3000Å with this thickness depending on the design chosen for the device in view of its planned utilization. Then, 5000Å of undoped polysilicon is deposited in a standard chemical vapor deposition process. This is followed by a deposition of silicon dioxide containing 12% phosphorus in a standard chemical vapor deposition process to a thickness of 4000Å. Finally, this silicon dioxide deposition is followed by providing over the last provided silicon dioxide layer, in a standard process, a photoresist layer having a desired pattern of openings therein.

The openings in this last provided photoresist layer are made to occur over those portions of the device in the feature regions where no gate region portions are to be provided for the MOS field-effect transistors being formed. Then, the silicon dioxide provided over the polysilicon is etched using buffered HF through these openings in the photoresist followed by using a standard plasma etch process to remove the undoped polysilicon where unwanted. Finally, this is followed by stripping away the photoresist through use of an etchant. The result is shown in FIG. 5 where the undoped polysilicon remaining is designated 119 and will form the gates for each of the MOS field-effect transistors being fabricated. The silicon dioxide remaining on the undoped polysilicon, originally uses a mask for forming the polysilicon gates, is designated 120. The silicon dioxide layer used as the gate oxide separating the gates 119 from the major surface of semiconductor material body 110 is designated 130.

Also shown in FIG. 5, is the result of providing the remainder of the lower conductivity terminating region portions, i.e., the remainder of the lower conductivity portions of the source and drain regions, which is accomplished through implanting boron ions with energy of 200kev and a dose of $10^{12}$ to $10^{13}$ ions/cm$^2$. The actual dose used in this range depends on the planned use intended for the device being formed. This implantation step uses both field oxide regions 114'' and polysilicon gates 119 with the silicon oxide caps 120 as implantation masks. As a result, the implanted lower conductivity portions just provided and formed in self-alignment with the field oxide and the gates already provided in each of the MOS field-effect transistors being formed. The pn junctions between the lower conductivity portions of the source and drain regions just formed and the other portions of semiconductor material body 110 extend to 0.3 μm below the major surface of this body.

These implanted regions forming the lower conductivity portion of the source and drain regions, i.e., of the terminating regions at the end of the channel of the MOS field-effect transistors being formed, are designated 121 and 122 in the high breakdown voltage, enhancement mode MOS field-effect transistor. Since region 108 has been merged into region 121 and region 107 has been merged into region 122, these entire regions are designated 121 and 122. Similarly, the implant regions forming the lower conductivity portions of the terminating regions of the high breakdown voltage, depletion mode MOS field-effect transistor are designated 123 and 124 (including therein regions 106 and 105 respectively). The implant region leading to the depletion mode characteristic has been redesignated 117' in view of its being substantially narrowed to being just below gate region 119 for that device.

The implant regions resulting from this last implantation step located where the source and drain regions will occur for the ordinary enhancement mode MOS field-effect transistor are designated 125 and 126. Finally, the implanted regions located where the source and drain regions will occur for the ordinary depletion mode MOS field-effect transistor are designated 127 and 128. Depletion mode region 118 has been redesignated 118' in view of its being substantially narrowed to being just below gate 119 for the ordinary depletion mode device.

The next step is to have the exposed silicon in the major surface of semiconductor material body 110 and the exposed polysilicon in gates 119 oxidized. This is accomplished by placing the device, as then formed, at 975° C. for 5 hours in an oxygen atmosphere containing 4% HCl. This results in thermally growing silicon dioxide on the exposed silicon and in causing the remnants of the phorphorus doped silicon dioxide layer 120 to flow over the remnants of the undoped polysilicon layer 119 to produce a smooth surface over the edge of the polysilicon gate. Thereafter, silicon dioxide is deposited in a standard chemical vapor deposition process to a depth of 4500Å such that silicon dioxide occurs all around polysilicon gate regions 119. This silicon dioxide, including gate oxide 130, is now generally designated by 130'.

This provision of silicon dioxide is followed by using a chemical vapor deposition process to provide undoped polysilicon to a depth of 5000Å on layer 130'. Thereafter, this last layer of undoped polysilicon is doped by phosphorus diffusion after which silicon dioxide is thermally grown over the phosphorus doped polysilicon to a depth of 800Å.

At this point, a photoresist layer is provided over the last layer of silicon dioxide and, a desired pattern of openings are provided in this photoresist layer, all done using a standard process. The openings in the photoresist layer are located above regions where no portion of the shield electrode is to extend, including over the ordinary MOS field-effect transistors. Then buffered HF is used to etch away the silicon dioxide layer below the photoresist layer openings followed by use of a HF/HNO₃/CH₃COOH mixture in a ratio of 1:100:110 to etch concentric openings in a polysilicon layer below the openings in both the photoresist layer and silicon dioxide layer. Then, the photoresist layer is stripped away by etching.

Figure 6:
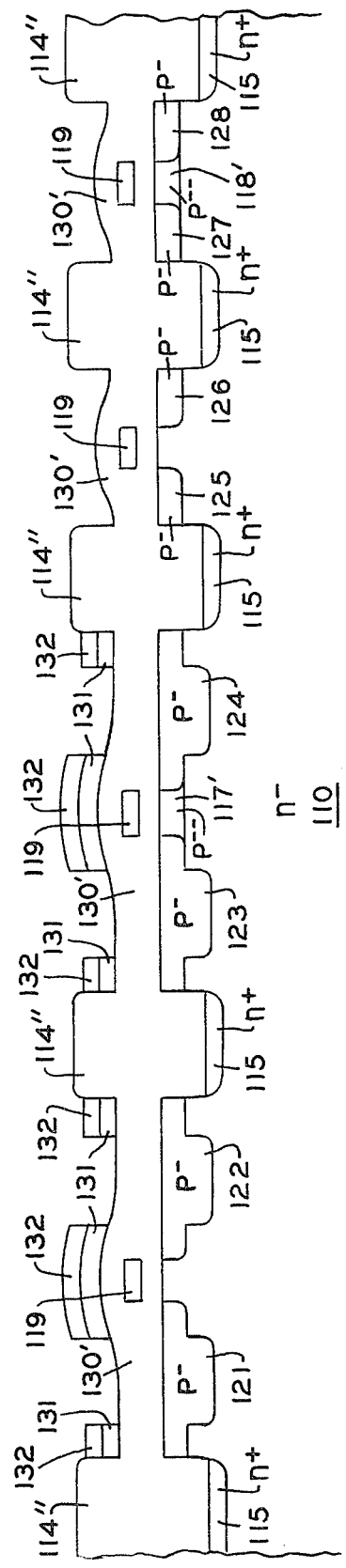

The results of these steps are shown in FIG. 6 where the remaining portions of the shield electrode polysilicon layer are designated 131. The silicon dioxide caps occurring over remaining polysilicon portions 131, used masks during the etching leading to this polysilicon, are designated 132.

With the forming of the polysilicon layer shield electrodes 131 completed through providing the openings in layers 132 and 131, silicon dioxide layer 130' is now etched using buffered HF. Polysilicon shield electrodes 131 and silicon dioxide field regions 114" serve as etching masks. Silicon dioxide cups 132 over shield electrodes 131 will be stripped away. The portions of silicon dioxide 130' over gate regions 119 in the ordinary MOS field-effect transistors will also be etched away so that these gate regions will also come to serve as etching masks along with adjacent field oxide regions 114" for these devices. Since field oxide regions 114" will also be etched to an extent, they are now relabed 114'''. This etching continues to the point where a thickness of 2000Å of layer 130' remains on the major surface of semiconductor material body 110 below the openings in layers 132 and 131 and at the source and drain regions for the ordinary MOS transistors.

This etching is followed by depositing in a standard chemical vapor deposition process, silicon dioxide containing 6% phosphorus to a depth of 6000Å over the entire device. Upon completing this deposition, the device so prepared is placed at a temperature of 1025° C. in an oxygen atmosphere for three hours to diffuse the implanted boron, forming regions 121, 122, 123, 124, 125, 126, 127 and 128, more deeply into semiconductor material body 110. The junction depths for these regions as a result reach approximately 0.4 μm below the major surface of semiconductor material body 110. This step also results in the just deposited, phosphorus doped silicon dioxide reflowing to provide a smooth edge over the shield electrodes 131. Further, during this diffusion step, not only does the implanted boron diffuse deeper in the regions, as indicated above, but also the phorphorus in the silicon dioxide 130' over and around the undoped polysilicon gates 119 diffuses simultaneously into these gates to dope the polysilicon therein to render these gates electrically conductive.

Figure 7:
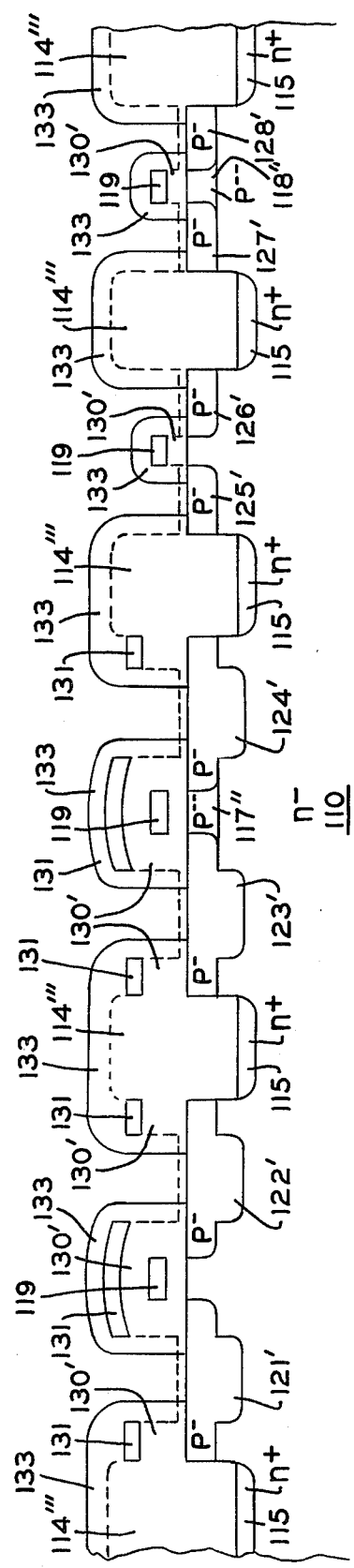

The last deposited layer of phosphorus doped silicon dioxide is designated 133 and shown separately in FIG. 7 even though it will be merged with silicon dioxide 130' and field oxide regions 114'''. To show these separate constituents to aid in understanding the steps performed, the remaining portions of field oxide 114''' and silicon dioxide layer 130' have been indicated by dashed lines in FIG. 7. However, the designation 133 will be used hereafter to designate the merged silicon dioxide structure.

The lower conductivity terminating region portions 121, 122, 123, 124, 125, 126, 127 and 128 have been redesignated in FIG. 7 as 121', 122', 123', 124', 125', 126', 127' and 128' in view of these regions having been further extended into this semiconductor material body 110 by diffusion. Similarly, the depletion mode region 117' and 118' have been redesignated in FIG. 7 as 117'' and 118'', respectively, because of these regions experienced the same greater extension into the semiconductor material body during the diffusion step.

Finally, there is also shown in FIG. 7 openings provided in silicon dioxide layer 133 (or the merged structure 133) exposing portions of the major surface of semiconductor material body 110 over more or less the centers of regions 121', 122', 123', 124', 125', 126', 127' and 128'. These are formed in a standard process by providing a layer of photoresist over the surface of layer 133 followed by providing openings in this photoresist layer at the desired locations of the openings in silicon dioxide layer 133 (structure 133). Thereafter, buffered HF is used to etch the desired openings in merged silicon dioxide structure 133 through the openings in the photoresist layer. Upon completion of the etching of layer 133, the photoresist is stripped away. These openings in merged silicon dioxide structure 133 are to be used for forming higher conductivity portions in the terminating regions, i.e., source and drain regions, of the MOS field-effect transistor devices being fabricated and for forming external interconnection structures.

The structure of FIG. 7 then has undoped polysilicon deposited thereon in a standard chemical vapor deposition process to a thickness of 3500Å. As a result, the exposed portions of the major surface of semiconductor material body 110 above regions 121', 122', 123', 124', 125', 126', 127' and 128' are under undoped polysilicon. This undoped polysilicon is implanted with boron ions at 120kev with a dose of $4 \times 10^{15}$ ions/cm$^2$. The now doped polysilicon is subjected to a temperature of 975° C. for one hour in an oxygen atmosphere which diffuses the boron in this last provided polysilicon into of semiconductor material body 110 where exposed where in contact with the doped polysilicon. At the same time, the doped polysilicon oxidizes with a thermally grown layer of silicon dioxide growing thereon and resulting in the doped polysilicon being thinned to 2000Å in thickness. Another result is the formation of shallow p+-type conductivity region in each of the terminating regions, i.e., source and drain regions, which go approximately 0.3 $\mu$m into semiconductor material body 110 below the major surface thereof.

The thermally grown oxide is then stripped away from the surface of the polysilicon. Then an alloy layer is deposited in a standard evaporation process to form the metallization used for the external interconnection means. The alloy layer chosen is copper-aluminum alloy having a thickness of 2.0 $\mu$m. A photoresist layer is deposited on this alloy metal layer in which openings are provided, all done in a standard process, at locations in which the interconnection metal is not to be present. Then $H_3PO_4/HNO_3/CH_3COOH$ mixture in a 50:1:5 ratio is introduced as an etchant through these openings to etch away the copper-aluminum alloy layer therebelow. Thereafter, the doped polysilicon exposed by removing selected portions of the copper-aluminum alloyed layer is etched away by a plasma etching process. This is followed by stripping the photoresist through an etching process. Finally, the device is completed by annealing the structure in forming gas, a mixture of 15% $H_2$ and 85% $N_2$ by volume, 450° C. for 30 minutes.

Figure 8:
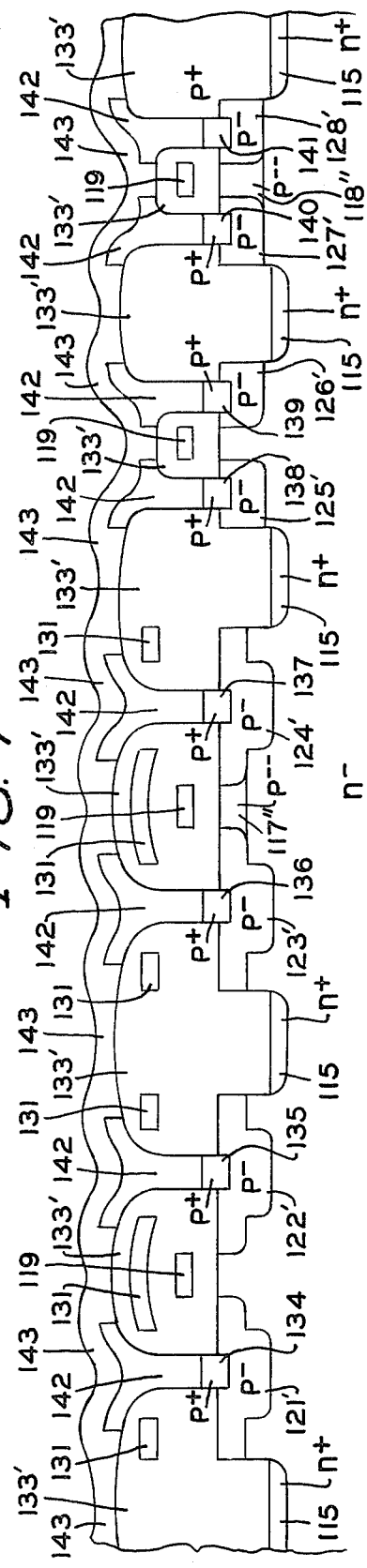

The results of these steps are shown in FIG. 8. The higher conductivity terminating region portions provided by the doped polysilicon, which also forms an interconnection contact interface between the semiconductor material 110 and the copper-aluminum alloy interconnection metallization, are designated 134 and 135 for the high breakdown voltage, enhancement mode MOS field-effect transistor. In the high breakdown voltage, depletion mode MOS field-effect transistor, the higher conductivity terminating region portions-interconnection interface formed by the doped polysilicon and the diffusion into the silicon semiconductor material body 110 are designated 136 and 137.

In the ordinary enhancement mode MOS field-effect transistor, the doped polysilicon forming the interface between the copper-aluminum interconnection metallization contacts and the semiconductor material body 110 and the diffused higher conductivity source and drain portions are designated 138 and 139. Although lower conductivity terminating region portions 125' and 126' are all around regions 138 and 139, respectively, such as to give a somewhat larger breakdown voltage for this transistor, the transistor will still behave primarily as an ordinary enhancement mode MOS field-effect transistor. This is because regions 138 and 139 are so close or under gate region 119 that the device will operate as such an ordinary transistor. Similar interface-higher conductivity regions for the ordinary depletion mode MOS field-effect transistor are designated 140 and 141. This transistor will behave much as an ordinary depletion mode transistor for the same reason described in connection with the ordinary enhancement mode MOS field-effect transistor.

The relatively high minimum breakdown voltage devices, either the enhancement mode or the depletion mode device, formed by the above process can be expected to have breakdown voltages of from 40 to in excess of 200 volts. On the other hand, the ordinary devices will have breakdown voltages under 40 volts. The devices shown constructed in FIGS. 1 through 8 are p-channel devices. Of course, by interchanging doping materials a similar process could be used to provide n-channel device.

The embodiments of the invention in which an exclusive property or right is claimed or defined as follows:

1. A method for constructing a field-effect transistor device at an outer major surface of a first semiconductor material body of a first conductivity type, said method comprising:

providing a first feature selection layer closely proximate at least a first major surface portion of said outer major surface but limited to avoid extending over a field surface portion in said outer major surface contiguous with and surrounding said first major surfaces portion, said first feature selection layer also having at least two openings therethrough which, when projected onto said outer major surface, enclose corresponding portions of said outer major surface which are spaced apart but contained entirely within said first major surface portion;

providing a field insulating means at said field surface portion of said outer major surface;

providing at least two lesser conductivity terminating region portions of a second conductivity type in said semiconductor material body intersecting said first major surface portion at locations so each includes one of said projection portions of said outer major surface, said lesser conductivity terminating region portions being spaced apart in said outer major surface;

removing said first feature selection layer;

providing a first electrical insulating layer of a first thickness on said outer major surface, at least at said first major surface portion, said first insulating layer having a first insulating layer major surface on a side thereof opposite from that insulating layer surface in contact with said first major surface portions;

providing a first gate region on at least a portion of said first insulating layer major surface across said first insulating layer from that space occurring between said two lesser conductivity terminating region portions;

providing at least two extended lesser conductivity terminating region portions of a second conductivity type in said semiconductor material body intersecting said first major surface portion and spaced apart in said first major surface portion to thereby form at least two spaced apart intersection surfaces in said outer major surface with each of said two intersection surfaces containing one of said projected surface portions, there being pn junctions resulting about each of said lesser conductivity terminating region portions and its associated extended lesser conductivity terminating region portion to thereby separate these regions from remaining portions of said first semiconductor material body with these said pn junctions intersecting said first major surface portion to form a boundary about each of said intersection surfaces in said first major surface portion, said first gate region being directly across said first insulating layer from that space in said first major surface portion separating said two intersection surfaces;

providing a second electrical insulating layer of a second thickness on said first gate region and extending beyond said first gate region to be across from substantially all of each adjacent said extended lesser conductivity terminating region portion, said second insulating layer having a second insulating layer major surface on a side thereof opposite that side thereof which is in contact with said first gate region;

providing a first shield region on at least a portion of said second insulating layer major surface across from said first gate region and across from each adjacent said extended lesser conductivity terminating region portion, but across from less than all of each adjacent said extended lesser conductivity terminating region portion at least by virtue of plurality of openings each provided through said first shield region and across from a contact surface located entirely within each said intersection surface; and providing higher conductivity terminating region portions of said second conductivity type in said semiconductor material body intersecting said first major surface portion at each of said contract surfaces across from each corresponding said opening in said first shield region, said higher conductivity terminating region portions having a conductivity occurring therein exceeding that occurring in those said extended lesser conductivity terminating region portions remaining after said providing of said higher conductivity terminating region portions, said lesser conductivity terminating region portions being contiguous with said higher conductivity terminating region portions everywhere except on that surface of said higher conductivity terminating region portions formed by intersecting with said first major surface portion.

2. The method of claim 1 wherein said providing of said first insulating layer is preceded by providing a low conductivity channel region of said second conductivity type in said semiconductor material body intersecting said first major surface portion.

3. The method of claim 1 wherein said first feature selection layer is also provided at a second major surface portion simultaneously with providing said first feature selection layer at said first major surface portion and in a similar manner, which is followed by providing a second field insulating means simultaneously with said providing of said first insulating means and in a similar manner, which is followed by providing at least two further lesser conductivity terminating region portions of a second conductivity type in said semiconductor material body intersecting said second major surface portion simultaneously with said providing of said two lesser conductivity terminating region portions intersecting said first major surface portion and in a similar manner, in which is followed by providing a low conductivity channel region of a second conductivity type in said semiconductor material body intersecting said second major surface portion, all these steps followed by (i) providing said first insulating layer also at said second major surface portion simultaneosly with providing said first insulating layer at said first major surface portion and in a similar manner, by (ii) providing a second gate region on said first insulating layer major surface across said first insulating layer from said second major surface portion simultaneously with said providing of said first gate region and in a similar manner, by (iii) thereafter providing at least two further extended lesser conductivity terminating region portions of a second conductivity type in said semiconductor material body intersecting said second major surface portion simultaneously with said providing of said extended two lesser conductivity terminating region portions intersecting said first major surface portion and in a similar manner, by (iv) thereafter providing said second electrical insulating layer on said second gate region simultaneously with providing said second insulating layer on said first gate region and in a similar manner, by (v) thereafter providing a second shield region on said second insulating layer major surface across from said second gate region simultaneously with said providing of said first shield region and in a similar manner, and finally by (vi) thereafter providing at least two further higher conductivity terminating region portions of said second conductivity type in said semiconductor material body intersecting said second major surface portion simultaneously with providing said higher conductivity terminating region portions intersecting said first major surface portion and in a similar manner.

4. The method of claim 1 wherein said first insulating layer is also provided at a second major surface portion simultaneously with providing said first insulating layer at said first major surface portion and is followed by (i) providing a second gate region on said first insulating layer major surface across said first insulating layer from said second major surface portion simultaneously with said providing of said first gate region and in a similar manner, by (ii) thereafter providing at least two further lesser conductivity terminating region portions of a second conductivity type in said semiconductor material body intersecting said second major surface portion simultaneously with providing said two extended lesser conductivity terminating region portions intersecting said first major surface portion and in a similar manner, by (iii) thereafter providing said second electrical insulating layer on said second gate region simultaneously with said providing of said second electrical insulating layer on said first gate region and in a similar manner, by (iv) thereafter avoiding any permanent provision of said first shield region on any portion of said second insulating layer across from said second major surface portion, and finally by (v) thereafter providing at least two further higher conductivity terminating region portions of said second conductivity type in said semiconductor material body intersecting said second major surface portion at those locations where said further lesser conductivity terminating region portions intersect said second major surface portion simultaneously with said providing of said higher conductivity terminating region portions intersecting said first major surface portion and in a similar manner.

5. The method of claim 1 wherein said lesser conductivity terminating region portions and said higher conductivity terminating region portions are provided, at least in part, by ion implantation with having passed a maximum of $1 \times 10^{13}$ ions of that dopant leading to said second conductivity type in said lesser conductivity terminating region portions per square centimeter through said intersection surfaces in excess of those dopant atoms leading to said first conductivity type in said semiconductor material body immediately adjacent said intersection surfaces.

6. The method of claim 2 wherein said first insulating layer is also provided at a second major surface portion simultaneously with providing said first insulating layer at said first major surface portion and is followed by (i) providing a second gate region on said first insulating layer major surface across said first insulating layer from said second major surface portion simultaneously with said providing of said first gate region and in a similar manner, by (ii) thereafter providing at least two further lesser conductivity terminating region portions of a second conductivity type in said semiconductor material body intersecting said second major surface portion simultaneously with providing said two extended lesser conductivity terminating region portions intersecting said first major surface portion and in a similar manner, by (iii) thereafter providing said second electrical insulating layer on said second gate region simultaneously with said providing of said second electrical insulating layer on said first gate region and in a similar manner, by (iv) thereafter avoiding any permanent provision of said first shield region on any portion of said second insulating layer across from said second major surface portion, and finally by (v) thereater providing higher conductivity terminating region portions of said second conductivity type in said semiconductor material body intersecting said second major surface portion at those locations where said further lesser conductivity terminating region portions intersect said second major surface portion simultaneously with said providing of said higher conductivity terminating region portions intersecting said first major surface portion and in a similar manner.

7. The method of claim 3 wherein said first insulating layer is also provided at a third major surface portion simultaneously with providing said first insulating layer at said first major surface portion and is followed by (i) providing a third gate region on said first insulating layer major surface across said first insulating layer from said third major surface portion simultaneously with said providing of said first gate region and in a similar manner, by (ii) thereafter providing at least two further lesser conductivity terminating region portions of a second conductivity type in said semiconductor material body intersecting said third major surface portion simultaneously with providing said two extended lesser conductivity terminating region portions intersecting said first major surface portion and in a similar manner, by (iii) thereafter providing said second electrical insulating layer on said third gate region simultaneously with said providing of said second electrical insulating layer on said first gate region and in a similar manner, by (iv) thereafter avoiding any permanent provision of said first shield region on any portion of said second insulating layer across from said third major surface portion, and finally by (v) thereafter providing at least two further higher conductivity terminating region portions of said second conductivity type in said semiconductor material body intersecting said third major surface portion at those locations where said latter further lesser conductivity terminating region portions intersect said third major surface portion simultaneously with said providing of said higher conductivity terminating region portions intersecting said first major surface portion and in a similar manner.

8. The method of claim 6 wherein said lesser conductivity terminating region portions and said higher conductivity terminating region portions are provided, at least in part, by ion implantation with having passed a maximum of $1 \times 10^{13}$ ions of that dopant leading to said second conductivity type in said lesser conductivity terminating region portions per square centimeter through said intersection surfaces in excess of those dopant atoms leading to said first conductivity type in said semiconductor material body immediately adjacent said intersection surfaces.

9. The method of claim 7 wherein said lesser conductivity terminating region portions and said higher conductivity terminating region portions are provided, at least in part, by ion implantation with having passed a maximum of $1 \times 10^{13}$ ions of that dopant leading to said second conductivity type in said lesser conductivity terminating region portions per square centimeter through said intersection surfaces in excess of those dopant atoms leading to said first conductivity type in said semiconductor material body immediately adjacent said intersection surfaces.

* * * * *